United States Patent [19]
Koren

[11] Patent Number: 5,863,809
[45] Date of Patent: Jan. 26, 1999

[54] MANUFACTURE OF PLANAR PHOTONIC INTEGRATED CIRCUITS

[75] Inventor: Uziel Koren, Fair Haven, N.J.

[73] Assignee: Lucent Technologies Inc., Murray Hill, N.J.

[21] Appl. No.: 827,598

[22] Filed: Mar. 28, 1997

[51] Int. Cl.⁶ ................................................ H01L 21/308
[52] U.S. Cl. ........................... 438/22; 438/29; 438/31; 438/42; 438/44; 372/43; 372/44; 372/46; 372/50; 385/14
[58] Field of Search .................................. 438/22, 29, 31, 438/42, 44, 46, 47; 372/43, 44, 45, 46, 50; 385/14; 257/83, 84, 85, 94, 98

[56] References Cited

U.S. PATENT DOCUMENTS 4,884,119  11/1989  Miller .
5,288,659   2/1994  Koch et al. .

Primary Examiner—Charles Bowers
Assistant Examiner—Keith Christianson

[57] ABSTRACT

The specification describes photonic integrated circuit structures, and methods for making structures in which the active and passive waveguides are coplanar, and further in which all the layers of both the active and passive device regions are essentially coplanar, resulting in a planar surface and design flexibility for contact pad and metallization placement. The fabrication strategy eliminates the deep etch used in conventional processing to form laser devices, and thereby eliminates the step between the laser mesa and the passive waveguide sections.

11 Claims, 4 Drawing Sheets

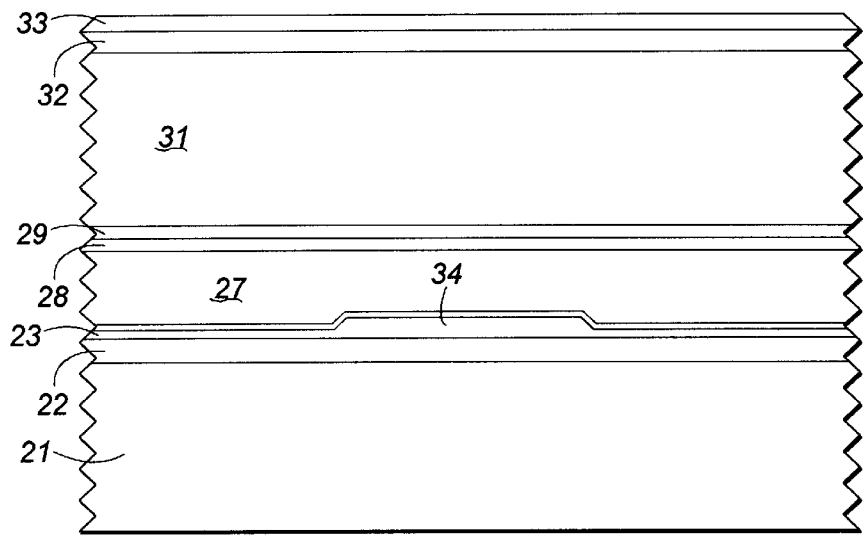
FIG. 4
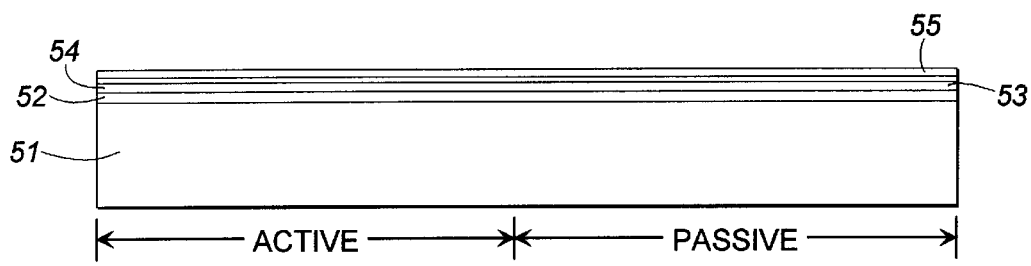
FIG. 5
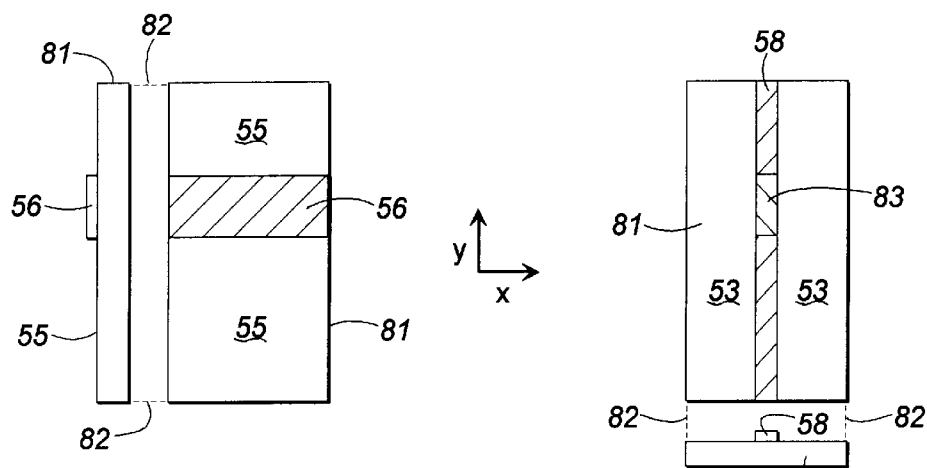
FIG. 6
FIG. 7

MANUFACTURE OF PLANAR PHOTONIC INTEGRATED CIRCUITS

FIELD OF THE INVENTION

This invention relates to photonic integrated circuit devices with both passive and active optical waveguide structures.

BACKGROUND OF THE INVENTION

Lightwave technology is evolving through development stages that in many ways mirror those of semiconductor electronics. The discrete device stage is largely over for lightwave technology, and it is proceeding rapidly to sophisticated levels of integration in what might be regarded as the lightwave phase of hybrid integration. Optoelectronic integrated circuits have the true characteristics of hybrid integrated circuits, and with the development of photonic integrated circuits (PICs) the elements of monolithic semiconductor ICs are emerging. PICs are single substrate ("chip") devices with integrated optical waveguides interconnecting active devices. Prominent among the active devices are lasers, which are the basic elements of most PIC devices.

Problems encountered in designing and fabricating PICs can be divided into two groups: optical engineering problems and optoelectronic-electronic engineering problems. An example of the former is the fabrication of low-loss optical waveguides with the associated constraints on doping types and levels. Another important optical problem is the design and fabrication of low-loss longitudinal coupling between active and passive portions of various guided-wave devices. Another optical problem is the requirement of strictly single-mode guides in the passive sections of the device. Lasers, being non-linear thresholding devices, are often fabricated without strictly fundamental-mode guides. In addition to the dimensional constraints introduced in making buried heterostructure guides strictly fundamental mode, the waveguides typical to most lasers are unsuitable for passive couplers or active waveguide switches due to their sensitive phase characteristics. This can result in large fluctuations in device properties due to the unavoidable fabrication tolerances encountered using presently available technology. For this reason, buried rib guides are preferred in non-thresholding devices such as couplers, switches, and filters. One must then devise a means of coupling between different guide types, i.e., buried heterostructures for lasers and buried rib waveguides for passive waveguides, in a self-aligned and low-loss fashion. It is also required, for low-loss coupling, that the waveguides being coupled are essentially coplanar.

A problem in the aforementioned optoelectronic-electronic category is the requirement for current blocking in lasers. As a consequence of this requirement, the typical laser device in PIC technology has a mesa structure. An example of this type of laser structure is a semi-insulating planar buried heterostructure (SIPBH) type laser as described by B. I. Miller, U. Koren, and R. J. Capik, Electron. Lett. 22,947 (1986). The use of mesa structures recalls a parallel stage of development in semiconductor technology that was, for a time, incompatible with the goal of surface planarity. Not surprisingly, there is now a similar compatibility issue in PIC technology between the planarity requirement of the waveguides, the mesa configuration of the laser, and goal of surface planarity.

The original approach in the art toward these goals was to form the active and passive regions separately and butt couple the two sections. Achieving effective coupling was difficult, and later attempts were made to integrate both sections on a common substrate. One approach along this line was to form the active layer stack over the whole circuit area, then remove the active stack in the passive regions, and regrow the passive layers adjacent the active layers. However, again, acceptable coupling of the waveguides between the two sections was difficult to obtain, and manufacturing yields were low.

In summary, the two planarity objectives described above can be relatively easily realized separately, but to date achieving both in a reliable, and cost effective process, and one that yields a truly integrated planar structure, has been elusive. Since the requirement for a planar optical interface cannot be compromised, the current processing sequence used to form the mesa (laser) structure and the buried rib waveguide of current PIC devices results in a severely stepped surface. A PIC device design, and a processing sequence, that produce a planar device surface, without compromising the device requirements outlined above, would be a major advance in PIC technology.

SUMMARY OF THE INVENTION

A new general PIC device has been developed, and a process sequence for making that device, that produces a laser waveguide structure that is essentially coplanar with an associated passive buried rib waveguide, and produces also a surface topography that is essentially planar. In the new PIC design the severe mesa for the laser device is eliminated, without additional process complexity, and without diminishing device performance. The PIC design of the invention is particularly suited for laser or amplifier arrays.

BRIEF DESCRIPTION OF THE DRAWING

FIGS. 3 and 4 are more detailed views of the device structure according to the invention; and FIGS. 5–14 are diagrams of process steps used to form the device of FIGS. 2–4.

DETAILED DESCRIPTION

Figure 1:
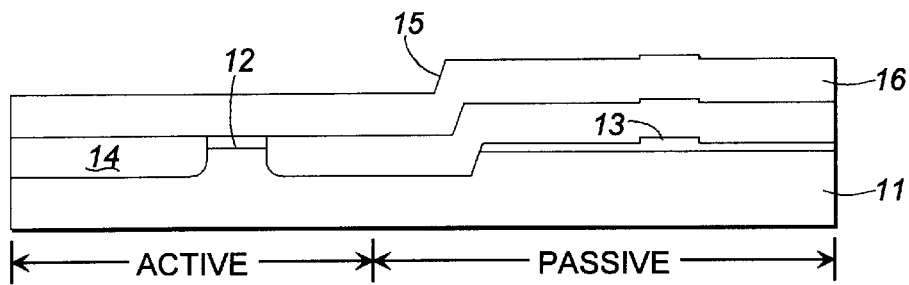
FIG. 1 is a schematic diagram of a prior art process for making PIC devices that illustrates the surface non-planarity described above.

Referring to FIG. 1, the surface non-planarity of prior art PIC devices is illustrated. As is known in the art these devices typically have a complex layered structure. The cross section of FIG. 1 is simplified to show just the essential active and passive elements side by side. An n-type InP substrate is shown at 11 with one side a passive waveguide section and the other an active device section. The waveguide layer 12 and the mesa structure on the active portion is a semi-insulating blocked buried heterostructure multi-quantum well laser waveguide. On the passive portion is a buried rib semi-insulating-clad waveguide 13. A semi-insulating layer 14 is deposited which fills the deep etched regions on the active side and serves as a lateral blocking layer for the laser waveguide 12. On the passive side layer 14 forms a low-loss upper cladding for the passive waveguide. However, layer 14 also produces a substantial step 15. The p-type InP upper cladding layer 16 for the laser waveguide 12 is deposited over layer 14 and replicates step 15, leaving a non-planar surface. Details of this device technology are given in "Semiconductor Photonic Integrated Circuits", Thomas L. Koch and Uziel Koren, IEEE Journal of Quantum Electronics, Vol. 27, No. 3, March 1991, pp. 641–653, and U.S. Pat. No. 5,288,659 issued Feb. 22, 1994 to Thomas L. Koch and Uziel Koren, both of which, to the extent necessary for a complete description, are incorporated herein by reference.

Figure 2:
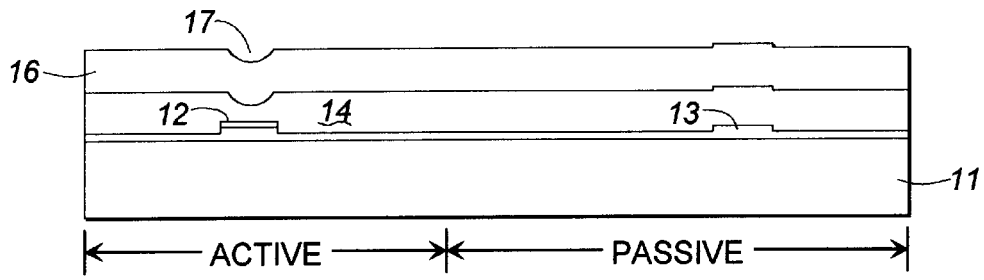
FIG. 2 is a schematic diagram for comparison with that of FIG. 1 showing the device design of the invention.

The PIC structure according to the invention is illustrated in a schematic view similar to that of FIG. 1 with the corresponding elements being denoted by the same reference numbers. It is evident that in the structure of the invention the step 15 that appears in the prior art structure has been eliminated. The layer 14 in FIG. 2, is essentially planar, as is the upper cladding layer 16 except for a localized depression 17. The transition between the active and passive regions, as well as the major portion of the device surface, preferably has no steps greater than approximately 2000 Angstroms.

Figure 3:
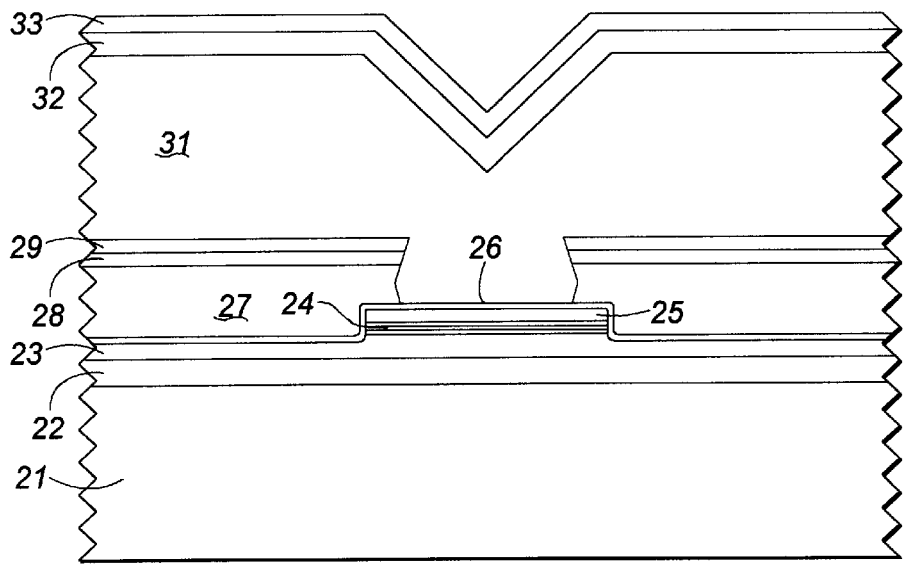

The structure according to the invention is shown in more detail in FIGS. 3 and 4. FIG. 3 represents a passive portion of the PIC, and FIG. 4 an active portion. Common reference numerals are used where the same feature is presented in both sections. It will be understood by those skilled in the art that the various elements in FIGS. 3 and 4 are not necessarily drawn to scale. Many of the details given herein to enable one skilled in the art to practice the invention are given by way of example, and represent a variety of options that are within the skill and choice of the device and process designers.

The substrate shown at 21 is an n-type InP relatively heavily doped semiconductor substrate. The primary waveguide stack is formed on substrate 21 in the first of three epitaxial growth operations. The primary waveguide stack includes four layers 22–25. These layers can be grown by Metal-Organic Chemical Vapor Deposition (MOCVD) or Molecular Beam Epitaxy (MBE) using procedures well known in the art.

The first layer 22 is a passive waveguide layer of InGaAsP with a photoluminescent wavelength, $\lambda_{PL}$, of 1.1 and a thickness of 1000–3000 Angstroms. A second passive waveguide layer 23 of InGaAsP with a $\lambda_{PL}=1.3$ and a thickness comparable to the thickness of layer 22 is grown over that layer. The third layer 24 is a MQW layer which is the active layer of the lasers. The fourth layer 25 is a relatively thin, i.e. 500–1000 Angstroms, protective layer of p-type InP. This protective layer serves to insure that the region above the active quantum well layer remains p-type to prevent remote or parasitic junction formation away from the quantum well junctions and impair their current injection efficiency.

The active MQW layer is desirably thin, i.e. less than 2500 Angstroms, to minimize the step between the quantum wells and the associated waveguide layers 22–23.

The active and passive regions of the PIC are defined by a chemically selective etch using a standard $SiO_2$ or photoresist mask as will be described in more detail below. After patterning both the active and passive regions a second epitaxial growth operation is performed to create the blocking regions of the PIC. The blocking layer in this embodiment is relatively thick, i.e. 1–3 $\mu$m, and comprises, in the particular embodiment described here, a stop etch quaternary layer 26 of 1.1 $\lambda_{PL}$, approximately 200–300 Angstroms in thickness, a thick, 1.2–1.4 $\mu$m, undoped InP layer 27, a p-InP layer 28, and an n-type InP layer 29. The undoped layer serves the primary blocking function. This layer may alternatively be made more insulating by iron doping. The n-type and p-type layers form a reverse biased junction that further inhibits current flow through the blocking layer. The thickness of these layers is that required to support a p-n junction, i.e. a few hundred to a few thousand Angstroms.

At this stage the contact vias for the active elements are defined by selectively removing the blocking layer over the active regions. The top p-InP layer 31 is then grown in the third growth operation which fills the recesses over the active regions, leaving a slight V-shaped surface depression as shown. This layer is relatively thick, i.e. 1.5–3.0 $\mu$m, to fill the slot over the active regions. The contact layer 32 is a ternary layer of InGaAs with a thickness of the order of 2000–4000 Angstroms. Metallized Au-Zn contact pad 33, which is representative of a planar metallization pattern, completes the structure. Other than the V-shaped depression over the active regions, the surface of the PIC is planar and additional metallization patterns, and contact pads, can be applied with nearly total design freedom.

FIG. 4 shows a passive section of the PIC and illustrates the coplanarity between the active and passive waveguides as well as the essentially coplanarity of the corresponding layers in both the active and passive sections up to and including the surface layers. The reference numbers show layers common to both structures. The passive waveguide is shown at 34.

A suitable processing sequence for forming the PIC structure shown in FIGS. 3 and 4 will be described in conjunction with FIGS. 5–14.

With reference to FIG. 5, the InP substrate 51 is shown with layers of the primary waveguide stack deposited on the substrate. Layer 52 is InGaAsP with a $\lambda_{PL}$ of 1.1 and a thickness of 1000 to 5000 Angstroms. Layer 53 is a core waveguide layer with $\lambda_{PL}=1.3$ and a thickness of 1000 to 5000 Angstroms. The active multiquantum well (MQW) layer is shown at 54 and comprises a series of typically 3–10 quantum wells each with a thickness of the order of 30–100 Angstroms. The wells are typically separated by 100–200 Angstroms of higher bandgap barriers. In the structure shown, the active layer has a thickness of approximately 1000 Angstroms. The material of the active layer depends on the emitting wavelength desired. For 0.98 micron systems the MQW material may be $Ga_{0.8}In_{0.2}As$ and the barrier layers GaAs. For 1.55 $\mu$m systems the quantum wells are typically quaternary InGaAsP compositions with boundary layers of higher bandgap quaternary material. In this description, no attempt is made to include the many possible permutations, e.g. single quantum wells, superlattices, graded bandgap regions, that can be used with this kind of laser diode structure. Also, for illustrative purposes a single active region and a single passive region are shown, and are so designated in the figures, but as is well known in this art the typical PIC may have several or many active regions and various different forms of active devices such as modulators and amplifiers. Also, well known are the materials suitable for these devices and waveguides. Typically these materials are combinations of Al, Ga, and In with As and P. These combinations are sufficiently established in this technology that layers such as layers 51–55 are characterized by optical properties, e.g. $\lambda_{PL}$ and those skilled in the art know the compositions and processing required to produce the layers.

Referring again to FIG. 5, the final layer of the primary stack is a protective layer 55 of p-type InP, approximately 200–3000 Angstroms and preferably 400–800 Angstroms, to prevent remote junction formation in the vicinity of the quantum well layer as mentioned earlier.

Layers 52–55 are grown by Metal-Organic Chemical Vapor Deposition (MOCVD) or Molecular Beam Epitaxy( MBE) using procedures well known in the art. Growth of the multiple layers is preferably a single growth operation, i.e. the layers are sequentially grown in the growth apparatus without interruption.

While the active layer is described here as a multi-quantum well layer, the active regions in a PIC device may have other structures and other functions. A bulk layer can be used for bulk lasers or for modulators or amplifiers. Typically a bulk layer is a 300–2000 Angstrom thick quaternary layer. Thus the term active layer or region is intended to include such bulk layer structures. The main feature of an active layer or region is that it is electrically accessible to activate it.

The primary waveguide stack is then patterned to form the active regions and their associated waveguides, and the passive waveguide regions. For simplicity in illustrating the process sequence, the passive waveguide sections are shown in FIGS. 5 and 8–14 alongside the active sections. However, in practice the passive sections typically interconnect, in a longitudinal dimension (with respect to the direction of light propagation), active regions of the PIC. To illustrate this, and to illustrate more clearly the steps used to define the active regions and the active and passive waveguides, plan views of the PIC are helpful. FIGS. 6 and 7 are plan views of a section of a typical PIC, 81, with the width dimension along the x-axis and the longitudinal dimension along the y-axis. FIG. 6 shows the first step in defining the active region, i.e. the removal of unwanted portions of the protective layer 55 and the active MQW layer 54. An active portion of the circuit is shown at 81 in FIG. 6 covered with layer 55. Etch mask 56, is shown covering the active regions to be retained. In this etch step only the longitudinal (y-axis) boundaries of the active regions are defined. For additional clarity, a schematic side section is shown connected to the plan view by dashed lines 82. The side view shows the position of the etch mask 56 with respect to the substrate and is included to illustrate the etching strategy for the process. The multiple layers have been omitted for simplicity. Layers 55 and 54 are then etched away using mask 56 to define the etch boundary, leaving a stripe of active material across the width (x-axis) of the device section.

A variety of etch procedures known in the art can be used to etch the various layers described in this work. Dry etch or plasma etches are frequently used in this technology. To make the embodiments described here wet etches were used, both selective etches and non-selective etches. The non-selective etchant was 1:1:10 $H_2O_2$, HBr, $H_2O$. The InP selective etch was 2:1 HCl, $H_3PO_4$, and the quaternary selective etch was 1:1:3 $H_2O_2$, $H_2O$, $H_2SO_4$.

After defining the lateral active region stripes the longitudinal (y-axis) waveguides for both the active and passive layers are defined. FIG. 7 shows a plan view of the same PIC section shown in FIG. 6 with etch mask 58 overlying the waveguide boundaries for all waveguides in the circuit. A front view of the masked substrate 81 is shown connected to the plan view by dashed lines 82 for further clarity. Again, the figure is presented to describe the etching strategy and the details, e.g. the multiple layers, are not shown. However, the top layer in the unmasked portion of FIG. 7 is layer 53, layers 55 and 54 having been removed from these regions in the etch step described in connection with FIG. 6. Thus mask 58 covers both active regions and passive waveguides. The active regions in FIG. 7 are indicated by the area 83.

Figure 8:
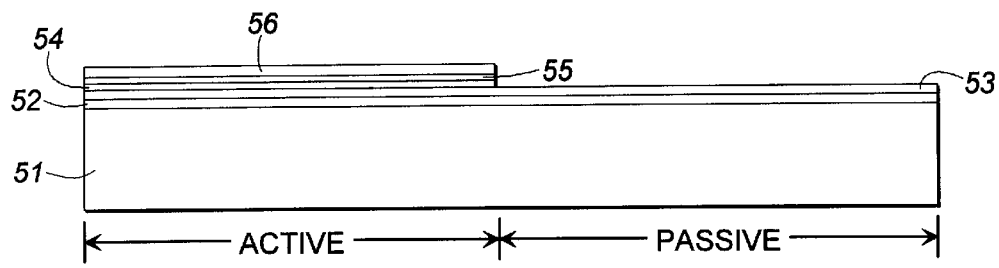
Figure 9:
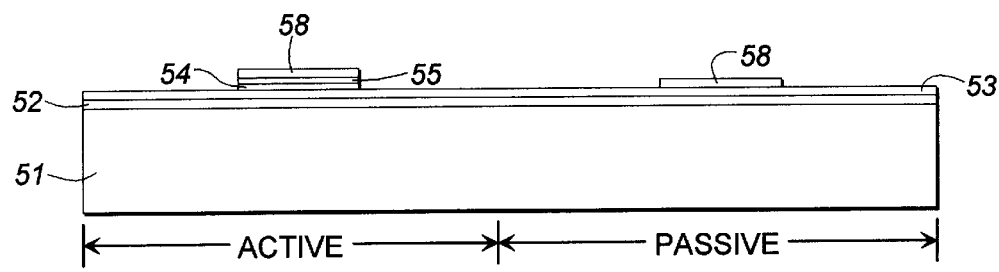
Figure 10:
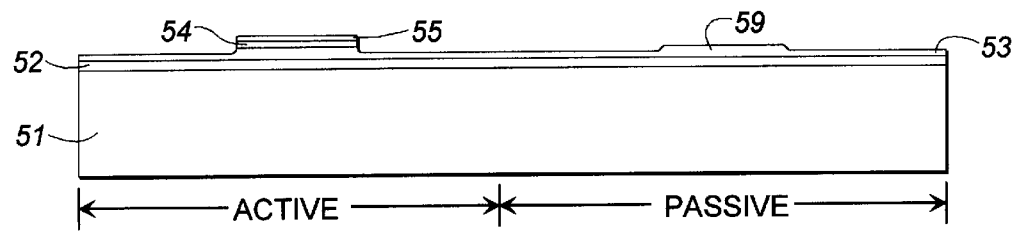

The etch strategy illustrated in FIGS. 6 and 7 is shown implemented in the device cross section in FIGS. 8 and 9, with FIG. 8 showing the multilayer structure after the etch described in connection with FIG. 6, and FIG. 9 corresponding to FIG. 7 but showing the active and passive regions separately with the etch mask 58 in place. After the etch using etch mask 58, and after removal of the etch mask, the PIC sections appear as in FIG. 10. The etch is stopped after partially removing waveguide layer 53 as shown. The resulting layer has a waveguide portion 59 which is substantially thicker, i.e. 300–1000 Angstroms, than the thickness of layers 52,53. A corresponding thick region of layers 52,53 is formed under the active region. The thick portion of the layer serves as the guiding region. The width of the waveguide stripes is typically in the range 1.55–3.0 microns. The objective is to maintain a single mode guide in the passive regions of the PIC. Thin waveguide layers are single mode to relatively large widths, while thicker waveguide regions should be narrower to retain single mode guide characteristics. If the active layer thickness is larger than the depth of the etch step used to define the side boundaries of region 59, a supplemental etch step is recommended to fully isolate the active regions. The preferred situation is to have the etch step that defines the waveguide width also etch through the unmasked thickness of the active region. That condition suggests that the thickness of the active layer be less than the depth of the etch used to define the waveguides, i.e. the difference between the thickness of region 59 and the thickness of layer 53.

Figure 11:
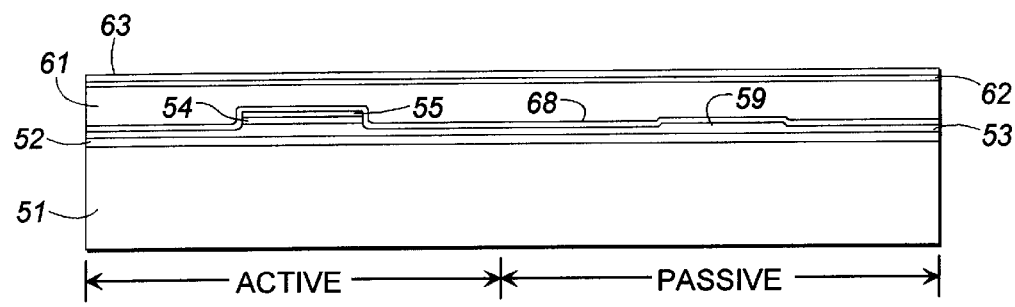

The next series of steps, in the second growth operation, form the blocking layer. As shown in FIG. 11, the blocking layer, in the particular embodiment described here, comprises a first etch stop layer 68, which is a 1.1 $\lambda_{PL}$ quaternary InGaAsP layer approximately 200–300 Angstroms thick. The primary blocking layer 61 is undoped InP and has a thickness of 1.2–1.4 $\mu$m. To further insure current blocking, a pnp structure is created by p-type InP layer 62 and n-type InP layer 63, both approximately 2000 Angstroms in thickness. These four layers are also preferably grown in a single uninterrupted growth operation.

Figure 12:
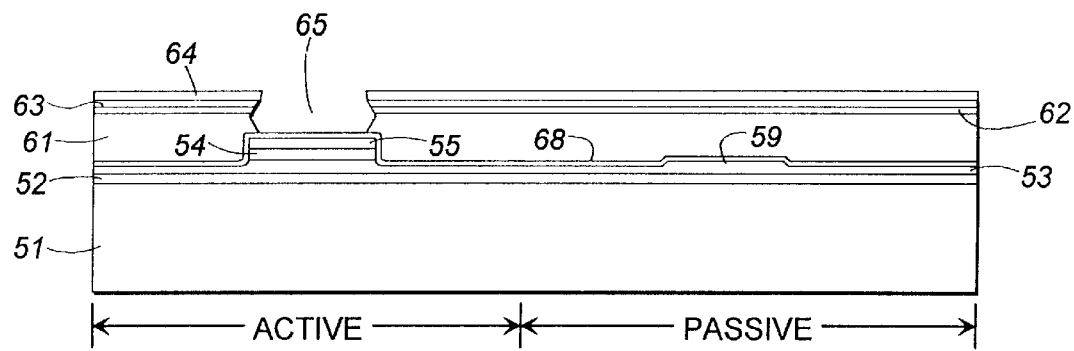
Figure 13:
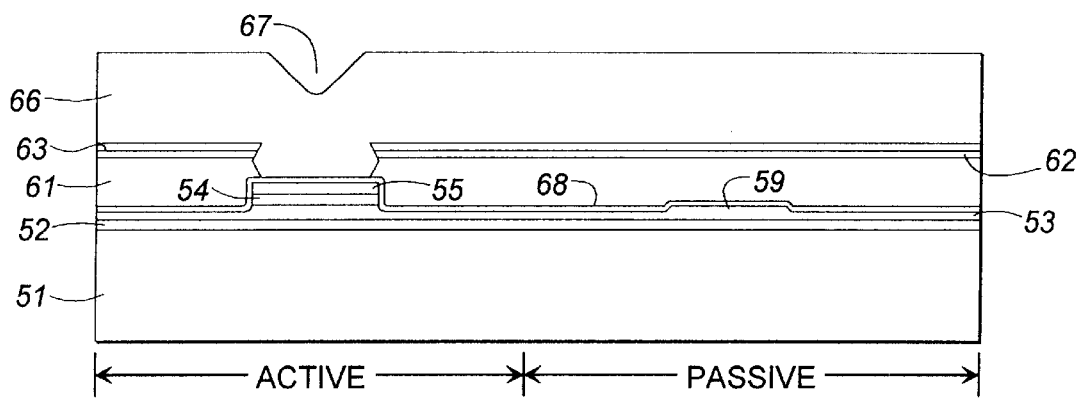

Next, as shown in FIG. 12, a photomask 64 is applied over the multiple blocking layers to define an opening 65 for the active region electrical via. An InP selective etch is used which stops at the etch stop layer 68. After removal of the mask 64, the third growth operation is performed to produce a thick p-type cladding layer 66 as shown in FIG. 13. This layer may be 1–3 $\mu$m thick and fills the slot 65 (FIG. 12) leaving a slight depression 67 in the surface of the device.

Figure 14:
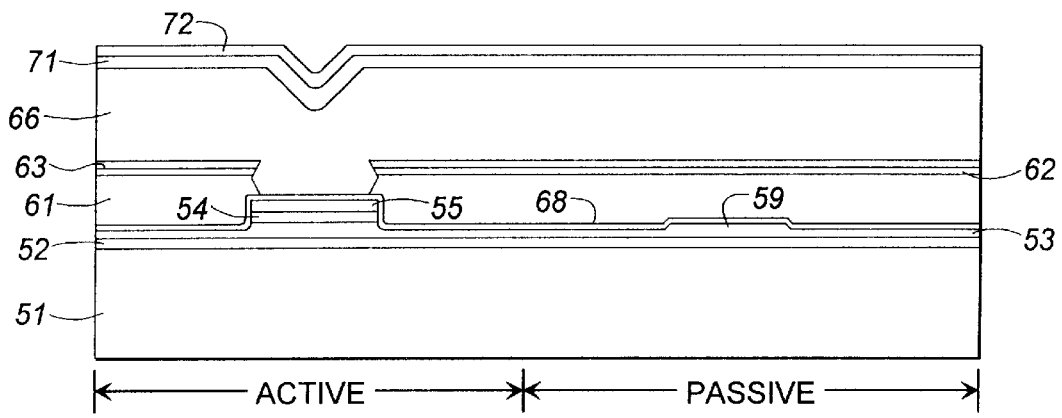

The capping layer 71, shown in FIG. 14, is grown at this stage and consists of approximately 3000 Angstroms of InGaAs. The contact layer 72 is an alloyed layer of Au-Zn which may be sputtered or evaporated and alloyed using conventional techniques. This layer is representative of an ohmic contact pad. An additional runner in a metallization pattern may also be used, and may have a composition selected from a variety of materials, e.g. TiPtAu. This second metallization pattern is commonly used for bonding pads.

While not shown in the figures PIC devices are typically coupled to input/output assemblies which may include one or more optical fibers. The planar configuration described here is particularly suited for arrays of optical amplifiers, switches and/or modulators, and these device arrays generally include many optical fiber input/outputs.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Method for the manufacture of photonic integrated circuits comprising at least one active device and at least one passive waveguide formed on a common substrate, the method comprising:
   a. growing a waveguide stack on the substrate, the waveguide stack comprising a waveguide layer, and an active layer,
   b. etching away selected portions of said active layer leaving at least one active region,
   c. etching selected portions of said waveguide layer at least partially through the thickness of the waveguide layer to form at least one passive waveguide,
   d. growing a blocking layer over the said active region and the said passive waveguide, said blocking layer being essentially planar,
   e. etching away a portion of said blocking layer overlying said active region thereby forming a slot over said active region,
   f. growing a cladding layer over the structure resulting from step e., said cladding layer having a thickness at least sufficient to fill the said slot over the active region leaving an essentially planar surface layer, and
   g. forming an electrical contact over a portion of said cladding layer.

2. The method of claim 1 in which the active region comprises a laser.

3. The method of claim 2 in which the step of growing a waveguide stack includes the growth of a multi-quantum well laser.

4. The method of claim 1 in which the substrate is InP.

5. The method of claim 4 in which the active layer comprises InGaAsP.

6. The method of claim 5 in which the said blocking layer has a thickness of 1–3 microns and comprises undoped InP.

7. The method of claim 1 in which the blocking layer is essentially planar throughout.

8. The method of claim 1 in which steps a,d, and f are epitaxial growth processes selected from the group consisting of Metal-Organic Chemical Vapor Deposition and Molecular Beam Epitaxy.

9. The method of claim 1 further including the steps of forming a p-n junction at the surface of said blocking layer to restrict current flow from the contact layer to the active region.

10. Method for the manufacture of photonic integrated circuits comprising at least one active region and at least one passive waveguide formed on a common substrate, said substrate having a length extending along a y-axis and a width extending along the x-axis, the method comprising:
   a. growing a waveguide stack on the substrate, the waveguide stack comprising a waveguide layer, and an active layer,
   b. masking selected portions of the active layer to define the y-axis dimension of the active region,
   c. etching away the exposed portions of said active layer, leaving portions of the active layer remaining,
   d. masking portions of the remaining active layer and portions of the waveguide layer to define the x-axis dimension of both the active region and the passive waveguide,
   e. etching the exposed portions of said waveguide layer at least partially through the thickness of the waveguide layer to form at least one passive waveguide,
   f. simultaneously etching the exposed portions of the active layer to form the active region,
   g. growing a blocking layer over the said active region and the said passive waveguide, said blocking layer being essentially planar,
   h. etching away a portion of said blocking layer overlying said active region thereby forming a slot over said active region,
   i. growing a cladding layer over the structure resulting from step e., said cladding layer having a thickness at least sufficient to fill the said slot over the active region leaving an essentially planar surface layer, and
   j. forming an electrical contact over a portion of said cladding layer.

11. The method of claim 10 in which in step e. the waveguide layer is etched through a thickness that exceeds the thickness of the active layer.

* * * * *